May 1, 1962 G. ZIELASEK 3,032,695

ALLOYED JUNCTION SEMICONDUCTIVE DEVICE

Filed March 10, 1958

INVENTOR

GOTTHOLD ZIELASEK

BY Kurt Nau

ATTORNEY 3,032,695

ALLOYED JUNCTION SEMICONDUCTIVE DEVICE

Gotthold Zielasek, Stuttgart, Germany, assignor to Robert Bosch G.m.b.H., Stuttgart, Germany Filed Mar. 10, 1958, Ser. No. 720,371
Claims priority, application Germany Mar. 20, 1957
15 Claims. (Cl. 317—234)

Figure 1:
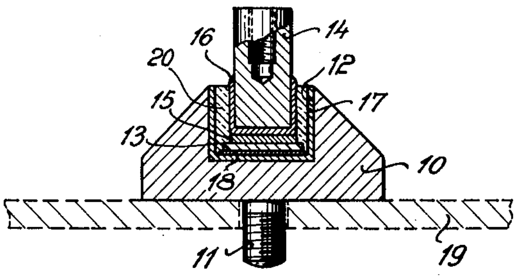

The present invention relates to improvements in alloyed or fused junction semiconductive devices, such as rectifiers and transistors, as well as to a novel method of manufacturing such devices.

According to known methods of fabricating semiconductive translating devices, a P-N semiconductive junction is formed by melting and alloying or diffusing an impurity member into a body or member of single-crystal semiconductive material of one conductivity type, that is either N or P, with suitable electrical terminal means or conductors being attached, such as by fusing or soldering, to said members. The molten impurity material dissolves in the semiconductor and after an appropriate time interval is allowed to recrystallize. The recrystallized material containing the impurity forms a P or N-region within the semiconductor, depending upon the type of the impurity, in such a manner as to result in a semiconductive P-N junction with the free or non-alloyed region of the semiconductor.

As an example, in producing a germanium power rectifier, a bead or disc of indium forming a trivalent or acceptor impurity may be alloyed to a slab or wafer of N-type single-crystal germanium soldered to a base of copper or the like metal to form a cooling body and first electrical terminal, a cooperating terminal conductor being soldered or fused to said indium disc or bead. The thus produced P-N junction between the germanium and the indium alloy forms an efficient diode rectifier. In order to produce a semiconductive germanium triode, a pair of indium beads or discs may be alloyed in the same manner into the opposite sides of an N-type slab or wafer of germanium, to result in a P-N-P germanium transistor.

If P-conductivity type germanium is used as the initial semiconductor material, the impurity member should be a donor or pentavalent element, such as arsenic, antimony etc., whereby to result in an N-P-N transistor upon alloying the opposite sides of a P-conductivity type slab of single-crystal germanium. Alternatively, other semiconductive materials, such as P or N-type silicon may be used for producing junction devices by this process.

In the known semiconductive devices of the above type, especially those provided with a terminal or metal base connected to a heat sink, the danger exists of traces of copper or other contaminating material penetrating from the terminal conductor or metal base into the solder alloy or indium or other impurity material and diffusing from there into the germanium or equivalent semiconductive material, especially if the latter is subjected to high temperatures during the alloying or diffusing process. These copper traces contaminate the semiconductor and may as a consequence affect or vary the parameters or operating characteristics of the rectifier or transistor, or eventually lead to an early breakdown. As is well known, the proper function of semiconductive devices of this type is predicated upon the initial purity of the semiconductive material, on the one hand, and the controlled contamination or "doping" of the material, on the other hand, to form predetermined and well-defined P and N-conductivity regions. Any subsequent contamination, therefore, even to a relatively slight degree, may result in a considerable number of rejects or unsatisfactory units.

It has already been proposed to prevent the above-mentioned diffusion of foreign contaminating matter from the metal electrodes or cooling base into the semiconductive material, by interposing thin sheets of nickel between the electrodes and the semiconductive member. In arrangements of this type, the nickel sheets must be soldered to the electrodes or the metal base, whereby to result in additional soldering connections and an increased transition resistance, both thermal and electrical. This, in turn, increases the heating losses, especially in the case of power rectifiers and transistors, thus reducing the safe maximum load or power capacity of the devices.

Accordingly, an important object of the present invention is the provision of means for and a novel method of making fused or alloyed junction semiconductive devices according to the alloying or fusion method, to substantially overcome the above and related difficulties and drawbacks inherent in the previous fabrication of semiconductive devices, in particular power rectifiers and transistors.

A more specific object of the invention is the provision of a fused or alloyed type semiconductive device and novel method of making the same, whereby penetration or diffusion of undesirable contaminating matter into the semiconductor is prevented, substantially without varying or otherwise deleteriously affecting the operating characteristics of the devices.

With these aims and objects in view, the invention involves generally the provision of improved means to substantially prevent the penetration or diffusion of disturbing matter into the fusion or alloying zone or zones of the semiconductor, said means consisting essentially in the coating of at least the surface portions of the terminal conductors and/or of the cooling body or metal base which are brought into contact with the soldering alloy or the impurity member or members during the alloying or fusion process, with a closely adherent protective metal layer, such as of nickel, having an adequate mechanical and thermal stability and adapted to prevent any diffusion therethrough of foreign or contaminating material and into the semiconductive material. As has been found, this protective layer should have a minimum thickness of 0.05 millimeter, or practically a thickness of the order of 0.1 to 0.2 millimeter and it advantageously has its surface brought into contact with the soldering alloy or impurity material roughened mechanically or chemically, to insure an intimate connection or bond of low transition impedance, both thermal and electrical, with the semiconductor and impurity members, respectively.

An important advantage, among others, of the invention compared with the use of separate nickel sheets according to the previous suggestions, is the fact that at least one soldering connection is dispensed with by the invention, thus greatly reducing the heat losses and increasing the power capacity of the devices, as well as enabling the alloying and soldering processes to be carried out in a single operating step or heating cycle. This, in turn, reduces the cost of fabrication and assembly, as well as the number of rejects or defective units.

The nickel or other protective metal layer may be applied to the conductors and metal base in any suitable manner, preferably by means of an electrolytic plating process, to insure a homogeneous coating and an intimate connection or bond having a minimum electric and thermal transition impedance.

Figure 2:
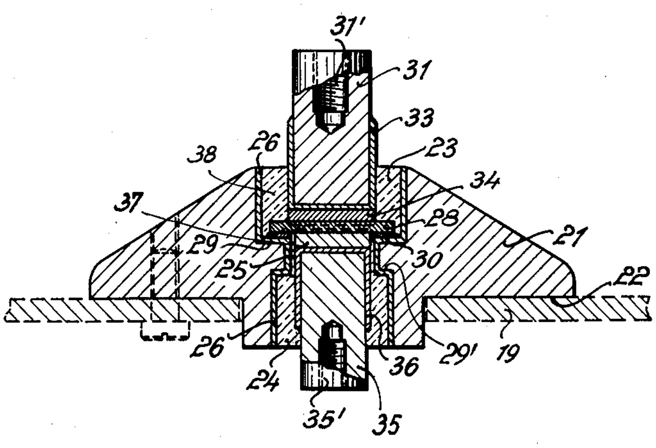

The invention, as to its ancillary objects and novel aspects, will be better understood from the following detailed description taking in reference to the accompanying drawing, forming part of this specification and wherein:

FIG. 1 is a vertical cross-sectional view of a junction power diode or rectifier and FIG. 2 is a similar sectional view of a junction triode or transistor structure embodying the principles of the invention.

Referring more particularly to FIG. 1 of the drawing, the power rectifier shown comprises a cooling body or metal base 10 of copper or the like high heat conducting metal and composed of a lower cylindrical portion and an upper truncated cone portion, in the example illustrated. Secured to the lower end of the body 10 is a threaded fixing stud 11 for mounting the rectifier upon a metallic chassis or heat sink 19. Mounted upon the bottom of a bore 12 in the body 10 coaxial with the stud 11 is a disc or wafer 13 of semiconductive material of one conductivity type, for example of N-type germanium, to the upper face of which is applied a terminal conductor 14 through a disc or layer 15 of trivalent impurity material, such as indium in the example mentioned. The terminal conductor 14 may be in the form of a copper cylinder having a diameter which is somewhat less than the diameter of the germanium disc 13, as shown in the drawing. The surface portion of the conductor 14 projecting into or being enclosed by the bore 12 of the body 10 is coated with a nickel or the like protective metal layer 16 preferably applied by means of a galvanic plating process and having a thickness of about 0.1 millimeter, the latter being shown greatly exaggerated in the drawing for clarity and simplicity of illustration. Similarly, the cooling body and cooperating electrical terminal 10 has a nickel coating 17 of like thickness applied to both the cylindrical and bottom surfaces of the bore 12.

In assembling the device, a disc 18 of tin or equivalent soldering alloy, which advantageously has been etched in hydrochloric acid or the like, is placed upon the nickel layer at the bottom of the bore 12 upon which disc are superimposed in succession a disc 13 of N-type germanium and an indium disc 15. There is then applied the terminal conductor 14 with its nickel-coated end surface in contact with the surface of the indium disc 15. The whole assembly which may be held in a suitable jig is then placed in a graphite form and subjected to a temperature of about 500 to 600° C. in an inert or reducing atmosphere. As a result, the indium alloys with the germanium, whereby to form a P-type conductivity region upon the surface of the germanium disc 13, in the example mentioned. The boundary between the P and N-regions indicated by the dotted line in the drawing, forms an effective unidirectional or rectifying junction, in a manner well known to those skilled in the art. At the same time, the indium acts as a soldering agent, to unite the terminal conductor 14 with the germanium disc 13 which, in turn, is intimately bonded to the cooling base 10 by the tin layer 18.

There is thus obtained by the use of the invention a permanent and efficient electrical connection as well as a low heat drop or impedance between the germanium disc 13, on the one hand, and the terminal conductor and cooling base 10, on the other hand, as a result of the combined single-step alloying and soldering operations. By connecting the base 10 to a metal plate or heat sink 19, efficient cooling or heat dissipation is insured in this manner, especially in the case of power rectifiers designed for relatively large load or operating currents.

Referring to FIG. 2 of the drawing, there is shown a power transistor constructed according to the invention and comprising a cooling base 21 consisting of copper or the like metal and having the form of a disc-shaped truncated cone, to provide an extended supporting surface 22 with the metal plate or heat sink 19 and to improve the heat transfer or cooling and, in turn, to increase the maximum permissible power output of the transistor. The body 21 has a central bore comprising an upper section 23 of relatively large diameter, a lower section 24 of relatively small diameter and a central section 25 of still smaller diameter, such as to provide annular shoulders 29 and 29' within the body 21 and between the bore sections 23 and 24. The entire inner surface of the bore of the body 21 including the sections 23, 24 and 25 is coated with a closely adherent nickel layer 26 of a thickness of about 0.1 millimeter.

Mounted within the upper bore section 23 is a thin disc or wafer 28 of semiconductive material, such as N-type germanium having its peripheral or edge zone soldered to the shoulder 29 through a tin or the like annular layer 30, to effect an efficient electrical as well as high heat conducting connection between the germanium disc 28 and the cooling base or body 21. Superimposed upon the germanium disc 28 is a cylindrical terminal conductor 31 of copper etc., having its upper end provided with a tapped bore 31' to receive a terminal screw or the like (not shown) and having its lower portion projecting into the bore section 23 coated with a nickel layer 33. Interposed between the lower nickel-coated face of the conductor 31 and the upper face of the germanium disc 28 is a thin layer or disc of indium 34 which serves both as an alloying metal for the germanium as well as a soldering agent to firmly secure the conductor 31.

In a similar manner, there is applied to the underface of the germanium disc 28 a second cylindrical conductor 35 of a somewhat smaller diameter and having a tapped bore 35', a further indium disc or layer 37 being interposed between the germanium disc 28 and the conductor 35 whose surface portion projecting into the bore section 24 is likewise coated with a layer 36 of nickel or the like protective material. The whole assembly thus forms a P-N-P transistor or semiconductive triode.

The construction of a transistor as shown, among other advantages, enables the complete assembly to be carried out in a suitable jig, in the manner described, whereupon the soldering of the terminal conductors 31 and 35, as well as the alloying of the indium impurity members 34 and 37 into the germanium 28 may be effected in a single operating step or heating cycle. For the latter purpose, the cooling body 21 together with the assembled parts may be placed in a graphite form or the like and heated to a temperature of about 550° in an inert atmosphere. As a result, indium is alloyed or diffused into the opposite sides of the germanium wafer 28 to a predetermined depth, as indicated by the dotted lines in the drawing, while producing at the same time, intimate and efficient soldering connections with the terminal conductors 31 and 35 and with the cooling base 21, respectively.

In order to seal the semiconductive device, to protect it from outside influences, the space of the bore 12 in FIG. 1 and the spaces of the bores 23, 24 and 25 in FIG. 2 are shown filled with an insulating mass 20 and 38, respectively, such as of a suitable casting or bonding resin or equivalent sealing material.

The prevention of the penetration or diffusion of contaminating foreign matter from the terminal conductors or from the cooling base into the alloying zone of the semiconductor is by no means limited to arrangements where copper is used as electrode or heat dissipating material. The invention makes it rather advisable generally, such as when using aluminum or other electrode and heat dissipating metal, to provide the surface portions of the electrodes and/or the cooling base which are brought into contact with the alloying or soldering material with a protective metal layer as proposed and described, to principally avoid any penetration or diffusion of undesirable foreign matter into either the alloyed or non-alloyed zones of the semiconductor and to hereby eliminate variations of the operating parameters or characteristics of the transistors and rectifiers, as well as related defects and drawbacks.

Moreover, it becomes possible by the use of the invention, especially in the case of power rectifiers or transistors requiring a considerable amount of metal to insure adequate heat transfer from the semiconductor, to use relatively cheaper and less pure metals, such as aluminum, coated with a suitable protective metal layer or layers in accordance with the present invention.

In the foregoing the invention has been described with reference to a specific illustrative device. It will be evident, however, that variations and modifications, as well as the substitution of equivalent parts or elements for those shown and described herein for illustration, may be made without departing from the broader spirit and purview of the invention as set forth in the appended claims. The specification and drawing are accordingly to be regarded in an illustrative rather than in a restrictive sense.

I claim:

1. A semiconductive power rectifier comprising a disc of single-crystal semiconductive material of one conductivity type, a disc comprising impurities overlying said first disc, said second disc being alloyed into said first disc, to provide a P-N junction diode, a heat conducting metal body and electrical terminal member having a cylindrical recess, said first disc soldered to the bottom of said recess, a further conductive terminal member soldered to said second disc and protruding outwardly from said recess, the inside surface of said recess and the outside surface portion of said further terminal member enclosed by said recess being coated with closely adherent protective metal layers, to substantially prevent diffusion of terminal metal into said semiconductive member during the alloying and soldering processes.

2. A power rectifier as claimed in claim 1, wherein said metal body and terminal member consist of copper and said metal layers consist of nickel having a thickness of the order of 0.05 to 0.2 millimeter.

3. A power transistor comprising a disc-shaped member of single-crystal semiconductive material of one conductivity type and a pair of disc-shaped impurity members attached to the opposite sides of and alloyed into said first member, to provide a semiconductor junction triode, a heat conducting metal body and electrical terminal member having a pair of aligned and communicating cylindrical recesses of different diameters, to provide a shoulder within said body, said first member having its peripheral portion soldered to said shoulder, and further cylindrical terminal members soldered to each said impurity members and protruding outwardly from said recesses, the inside surface of said recesses and the outside surface portions of said terminal members enclosed by said recesses being coated with closely adherent protective metal layers, to substantially prevent diffusion of terminal metal into said semiconductive disc member during the alloying and soldering processes.

4. A power transistor as claimed in claim 3, wherein said metal body and terminal members consist of copper and said metal layers consist of nickel having a thickness of the order of 0.05 to 0.2 millimeter.

5. A power transistor as claimed in claim 3, wherein said first member consists of N-type germanium and said impurity members consist of indium, to provide a P-N-P junction transistor, and wherein said metal body and terminal members consist of copper and said metal layers consist of nickel having a thickness of the order of 0.05 to 0.2 millimeter.

6. A power rectifier comprising a disc-shaped member of single-crystal semiconductive material of one conductivity type and a disc-shaped impurity member attached to and alloyed into said first member, to provide a P-N junction diode, a heat conducting metal body and electrical terminal member having a cylindrical recess, said first member soldered to the bottom of said recess, a further conductive terminal member soldered to said second member and protruding outwardly from said recess, and a mass of insulating sealing material filling said recess.

7. A power transistor comprising a disc of single-crystal semiconductive material of one conductivity type and a pair of impurity discs attached to the opposite sides of and alloyed to said first disc, to provide a semiconductor junction triode, a heat conducting metal body and electrical terminal member having a pair of aligned and communicating cylindrical recesses of different diameters, to provide a shoulder within said body, said first disc having its peripheral portion soldered to said shoulder, further cylindrical conductive terminal members soldered to each said impurity discs and protruding outwardly from said recesses, and a mass of insulating sealing material filling said recesses.

8. A semiconductor rectifier comprising a single-crystal semiconductor member of one conductivity type, an impurity member alloyed to one surface of said first member, to provide a P-N rectifier junction, a relatively large heat conducting metal body and electrical terminal member having a fractional surface area coated with a thin and closely adherent protective layer of a different metal and minimum thickness, to prevent diffusion therethrough of the terminal metal upon heating, said layer adjoining the opposite surface of said first member, a layer of intervening alloying metal connecting said body to said semiconductor member, and a cooperating conducting terminal member having a fractional surface area coated with a thin and closely adherent protective metal layer similar to said first layer and alloyed to said impurity member.

9. In a power rectifier as claimed in claim 8, wherein said body and further terminal member consist of copper and said metal layers consists of nickel having a thickness of the order of 0.05 to 0.2 millimeter.

10. A transistor comprising a single-crystal semiconductor member of one conductivity type, a pair of impurity members alloyed to opposite sides of said first member, to provide a semiconductor junction triode, a relatively large heat conducting metal body and electrical terminal member having a fractional surface area coated with a thin and closely adherent protective layer of a different metal and minimum thickness, to prevent diffusion therethrough of terminal metal upon heating, said layer adjoining a peripheral portion of said semiconductor member, a layer of intervening alloying metal connecting said body to said semiconductor member, and a pair of cooperating conducting terminal members having fractional surface areas coated with thin and closely adherent protective metal layers similar to said first layer and each alloyed to one of said impurity members.

11. In a power transistor as claimed in claim 10, wherein said metal body and terminal members consist of copper and said metal layers consist of nickel having a thickness of the order of 0.05 to 0.2 millimeter.

12. A semiconductor power rectifier comprising a semiconductor member having adjoining regions of different conductivity type, to provide a P-N rectifier junction, a heat conducting metal body and electrical terminal member having a recess, said member being mounted within said recess with one of the regions thereof mechanically and electrically connected to the bottom of said recess, a cooperating terminal member connected to the other region of said member and protruding outwardly from said recess, the inside surface of said recess and the surface portion of said last-mentioned terminal member enclosed by said recess being coated with thin and closely adherent protective layers of a different metal and minimum thickness, to substantially prevent diffusion therethrough of terminal metal into said semiconductor member.

13. A power transistor comprising a member of single-crystal semiconductor material of one conductivity type and a pair of impurity members alloyed to the opposite sides of said member, to provide a semiconductor junction triode, a heat conducting metal body and terminal member having a pair of communicating recesses upon the opposite sides thereof separated by an inwardly projecting shoulder within said body, said member having its peripheral area mechanically and electrically connected to said shoulder, a pair of cooperating metal terminal members each connected to one of said impurity members and projecting outwardly from said recesses, and a mass of insulating sealing material filling said recesses.

14. A semiconductor device comprising a single-crystal semiconductor member having at least two adjoining regions of different conductivity type, to form a P-N junction, a pair of high heat conducting metal terminal members having fractional surface areas coated with thin and closely adherent protective layers of a different metal and minimum thickness, to substantially prevent diffusion therethrough of the terminal metal upon heating, said terminal members being arranged with their coated areas each adjoining one of the regions of said semiconductor member in large-surface contact therewith and being connected thereto by intervening layers of alloying material.

15. A power transistor comprising a member of single-crystal semiconductor material of one conductivity type, a pair of impurity members alloyed to the opposite sides of said first member, to provide a semiconductor junction triode, a heat conducting metal body and terminal member having a pair of communicating recesses upon the opposite sides thereof separated by an internal shoulder, said first member having its peripheral area mechanically and electrically connected to said shoulder, a pair of cooperating metal terminal members each connected to one of said impurity members and projecting outwardly from said recesses, a mass of insulating sealing material filling said recesses, and closely adherent protective coatings upon the inside surface of said recesses and the surface portions of said cooperating terminal members enclosed by said recesses, said coatings consisting of a different metal and having a minimum thickness, to substantially prevent diffusion therethrough of terminal metal upon heating.

References Cited in the file of this patent

UNITED STATES PATENTS

| | | |
|---|---|---|
| 2,780,758 | Zetwo | Feb. 5, 1957 |
| 2,790,940 | Prince | Apr. 30, 1957 |
| 2,815,472 | Jackson et al. | Dec. 3, 1957 |
| 2,836,878 | Shepard | June 3, 1958 |
| 2,842,831 | Pfann | July 15, 1958 |
| 2,849,664 | Beale | Aug. 26, 1958 |
| 2,866,929 | Cooper | Dec. 30, 1958 |
| 2,909,715 | Adcock | Oct. 20, 1959 |
| 2,930,948 | Eannarino et al. | Mar. 29, 1960 |